(12) United States Patent
Chen et al.

(10) Patent No.: US 9,247,653 B2
(45) Date of Patent: Jan. 26, 2016

(54) FLEXIBLE ELECTRONIC COMPONENT MODULE

(71) Applicant: INDUSTRIAL TECHNOLOGY RESEARCH INSTITUTE, Hsinchu (TW)

(72) Inventors: Chang Yi Chen, Hsinchu (TW); Yung Min Hsieh, Hsinchu County (TW); Chang Ho Liou, Changhua County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 153 days.

(21) Appl. No.: 14/106,231

(22) Filed: Dec. 13, 2013

(65) Prior Publication Data

US 2014/0369008 A1    Dec. 18, 2014

(30) Foreign Application Priority Data

Jun. 14, 2013  (TW) ............................ 102121046 A

(51) Int. Cl.
*H05K 7/06* (2006.01)
*H05K 3/36* (2006.01)
*H05K 1/02* (2006.01)
*H05K 3/32* (2006.01)

(52) U.S. Cl.
CPC .............. *H05K 3/361* (2013.01); *H05K 1/0289* (2013.01); *H05K 3/323* (2013.01); *H05K 2201/0367* (2013.01)

(58) Field of Classification Search
CPC ........... H05K 7/06; H05K 3/46; H05K 1/118; H05K 3/30
USPC .................. 361/746, 736, 760, 762, 767, 794
See application file for complete search history.

(56) References Cited

U.S. PATENT DOCUMENTS

| 4,037,080 | A |   | 7/1977 | Owen |
|-----------|---|---|--------|------|
| 5,406,891 | A |   | 4/1995 | Kunczynski |
| 5,513,293 | A |   | 4/1996 | Holland et al. |
| 6,097,612 | A | * | 8/2000 | Ishikawa ................. H01L 23/66 174/535 |
| 6,543,299 | B2 |  | 4/2003 | Taylor |
| 7,518,287 | B2 | * | 4/2009 | Hirasawa ............. G02B 27/646 310/323.02 |
| 7,595,997 | B2 | * | 9/2009 | Nomiya .............. H01L 21/4803 257/700 |

(Continued)

FOREIGN PATENT DOCUMENTS

| TW | M273168  | 8/2005 |
| TW | 201117376 | 5/2011 |
| TW | I388258  | 3/2013 |

OTHER PUBLICATIONS

TIPO office action with an appended search report dated Feb. 11, 2015 for corresponding Taiwan application 102121046.

(Continued)

*Primary Examiner* — Nguyen T Ha
(74) *Attorney, Agent, or Firm* — WPAT, P.C.; Anthony King

(57) ABSTRACT

A flexible electronic component module includes a first substrate and a second substrate. The first substrate overlaps the second substrate to define at least one first exposed portion and at least one second exposed portion. The at least one first exposed portion includes a first electrode layer and the at least one second exposed portion includes a second electrode layer. The first electrode layer is disposed on a lower surface of the first substrate and the second electronic layer is disposed on an upper surface of the second substrate.

16 Claims, 10 Drawing Sheets

(56) References Cited

U.S. PATENT DOCUMENTS

| | | | | |
|---|---|---|---|---|
| 7,835,159 B2* | 11/2010 | Mishiro | | H05K 3/361 |
| | | | | 361/755 |
| 7,944,008 B2 | 5/2011 | Parks et al. | | |
| 8,853,554 B2* | 10/2014 | Lin | | G06F 3/042 |
| | | | | 174/255 |
| 2012/0176751 A1* | 7/2012 | Sakai | | H01Q 1/38 |
| | | | | 361/746 |

OTHER PUBLICATIONS

Chih-Fan Hu et al., "Implementation of a Flexible Silicon-BasedTactile Sensor Array", IEEE Sensors 2010 Conference, pp. 1736-1739.

Kiwon Lee et al., "Ultrasonic Anisotropic Conductive Films (ACFs) Bondingof Flexible Substrates on Organic Rigid Boards at Room Temperature", Proceedings—57th Electronic Components and Technology Conference 2007, ECTC '07, pp. 480-486.

Chao-Ming Lin et al., "Failure Probability Estimation of AnisotropicConductive Film Packages With AsymmetricUpper-to-Lower Pad Size and Misalignment Offsets", IEEE Transactions on Device and Materials Reliability, vol. 11, No. 3, Sep. 2011, pp. 368-377.

Priyanka Misri et al., "Evaluation of Anisotropic Conductive Film", IEEE Transactions on Components and Packaging Technologies, vol. 29, No. 4, Dec. 2006, pp. 809-817.

Estefania Abad et al., "Development of a flexible tag microlab", Proceedings of SPIE—The International Society for Optical Engineering, 2005, vol. 5836, pp. 599-606.

Jia Lei et al., "Evaluation of a double-layer anisotropic conductive film (ACF) for fine pitch chip-on-glass (COG) interconnection", 6th International Conference on Electronics Packaging Technology, 2005.

* cited by examiner

FLEXIBLE ELECTRONIC COMPONENT MODULE

TECHNICAL FIELD

The present disclosure is generally related to a splice module and, to a flexible electronic component module and an array.

BACKGROUND

A flexible electronic component module has its flexibility. With this characteristic feature, a flexible electronic component module facilitates the design of a large-size array that would otherwise not be easily attainable by using non-flexible electronic component modules. In some existing large-size arrays formed by flexible electronic component modules, staples are widely used to connect the component modules in a splice structure, which causes unsmooth surface at the splice structure. Consequently, the flexibility of the large-size array is limited and the splice structure is liable to damage when the large-size array is folded.

SUMMARY

In accordance with an embodiment of the present disclosure, a flexible electronic component module comprises a first substrate and a second substrate. The first substrate includes a first electrode layer. The second substrate includes a second electrode layer. The first substrate overlaps the second substrate and together define at least one of a first exposed portion and a second exposed portion. The first electrode layer is disposed on a lower surface of the first substrate and the second electrode layer is disposed on an upper surface of the second substrate.

In accordance with an embodiment of the present disclosure, a splice structure comprises a first flexible electronic component module, a second flexible electronic component module and a vertical conductive layer.

The first flexible electronic component module comprises a first substrate including a first electrode layer, and a second substrate including a second electrode layer. The first substrate overlaps the second substrate and together define at least one of a first exposed portion and a second exposed portion. The first electrode layer is disposed on a lower surface of the first substrate and the second electrode layer is disposed on an upper surface of the second substrate. The first electrode layer of the first substrate extends to the second exposed portion and the second electrode layer of the second substrate extends to the second exposed portion. The first exposed portion includes a plurality of bump electrodes disposed on the first electrode layer or the second electrode layer. Moreover, each of the bump electrodes is partially facing the electrode layer.

The second flexible electronic component module comprises a first substrate including a first electrode layer, and a second substrate including a second electrode layer. The first substrate overlaps the second substrate and together define at least one of a first exposed portion and a second exposed portion. The first electrode layer is disposed on a lower surface of the first substrate and the second electrode layer is disposed on an upper surface of the second substrate. The first electrode layer of the first substrate extends to the second exposed portion and the second electrode layer of the second substrate extends to the second exposed portion. The first exposed portion includes a plurality of bump electrodes disposed on the first electrode layer or the second electrode layer. Moreover, each of the bump electrodes is partially facing the electrode layer.

The vertical conductive layer is coupled between the bump electrodes of the first exposed portion of the first flexible electronic component module, one of the first electrode layer and the second electrode layer of the first exposed portion of the first flexible electronic component module, and one of the first electrode layer and the second electrode layer of the second exposed portion of the second flexible electronic component module.

In accordance with an embodiment of the present disclosure, a splice structure comprises a first flexible electronic component module, a second flexible electronic component module and a vertical conductive layer.

The first flexible electronic component module comprises a first substrate including a first electrode layer, and a second substrate including a second electrode layer. The first substrate overlaps the second substrate and together define at least one of a first exposed portion and a second exposed portion. The first electrode layer is disposed on a lower surface of the first substrate and the second electrode layer is disposed on an upper surface of the second substrate.

The second electrode layer of the second substrate extends to the first exposed portion and the second exposed portion.

The flexible electronic component module comprises a first substrate including a first electrode layer, and a second substrate including a second electrode layer. The first substrate overlaps the second substrate and together define at least one of a first exposed portion and a second exposed portion. The first electrode layer is disposed on a lower surface of the first substrate and the second electrode layer is disposed on an upper surface of the second substrate.

The second electrode layer of the second substrate extends to the first exposed portion and the second exposed portion.

The vertical conductive layer is coupled between the second electrode layer of the first exposed portion of the first flexible electronic component module and the second electrode layer of the second exposed portion of the second flexible electronic component module.

BRIEF DESCRIPTION OF THE DRAWINGS

Details of one or more embodiments of the disclosure are set forth in the accompanying drawings and the description below. Other features and advantages of the disclosure will be apparent from the description, drawings and claims.

DETAIL DESCRIPTION

Figure 1:
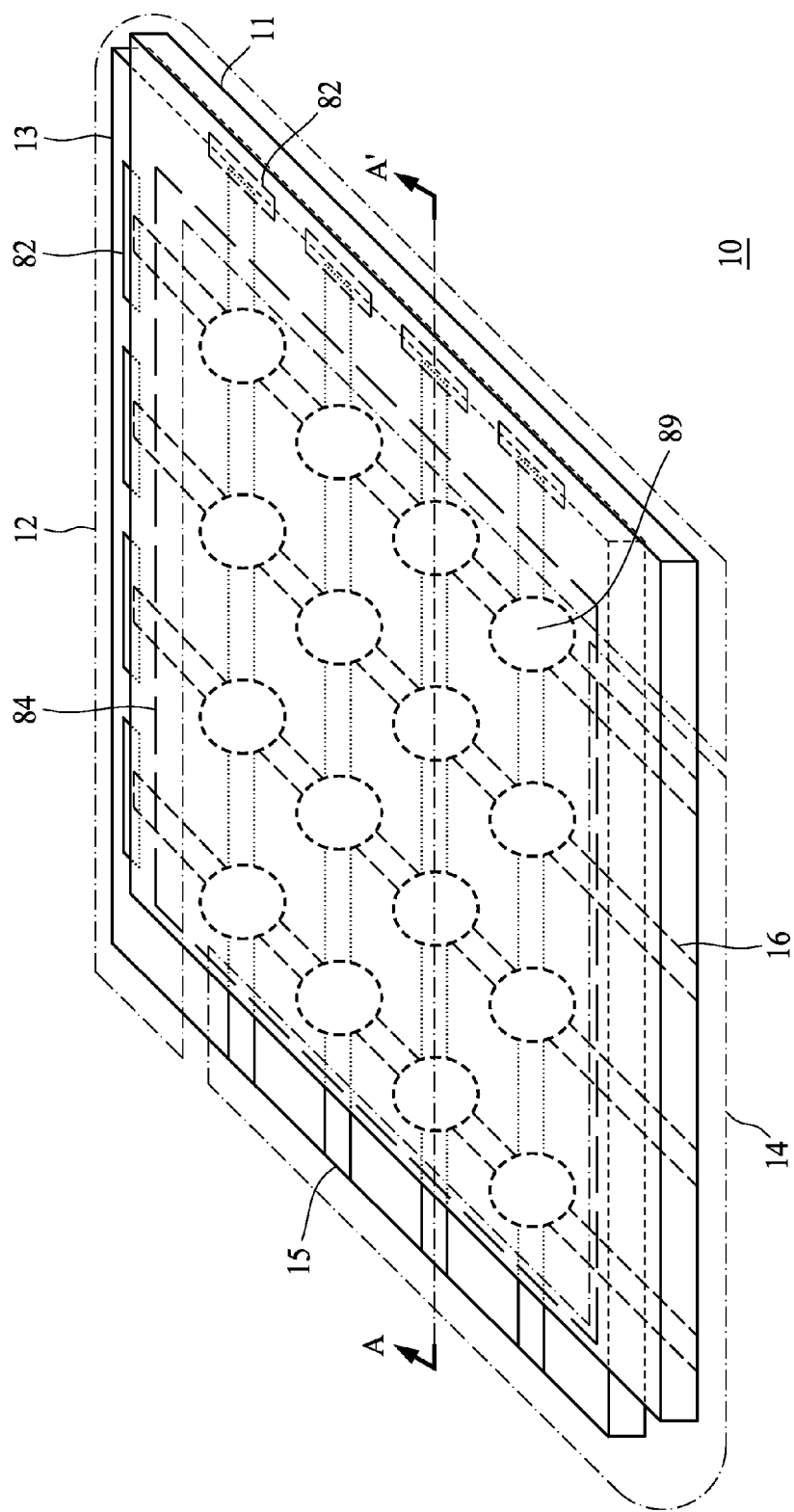
FIG. 1 is a schematic diagram of a flexible electronic component module in accordance with an embodiment of the present disclosure.

Embodiments or examples of the disclosure illustrated in the drawings are now described in specific languages. It will nevertheless be understood that no limitation of the scope of the disclosure is thereby intended. Any alterations and modifications in the described embodiments, or any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral.

Figure 2:
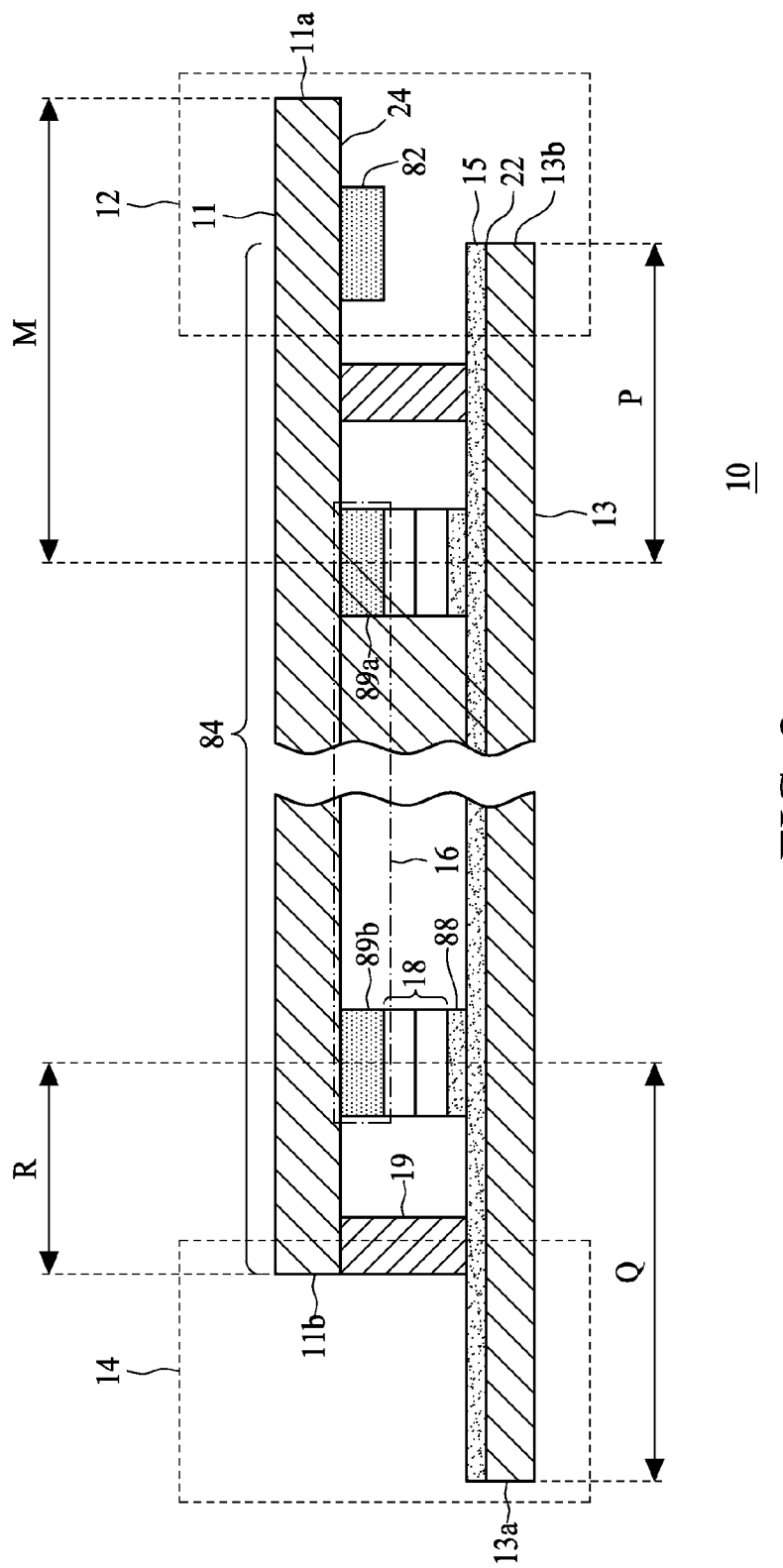
FIG. 2 is a cross-sectional view of the flexible electronic component module taken along a line AA' illustrated in FIG. 1 in accordance with an embodiment of the present disclosure.

FIG. 1 is a schematic diagram of a flexible electronic component module 10 in accordance with an embodiment of the present disclosure. FIG. 2 is a cross-sectional view of the flexible electronic component module 10 taken along line AA' illustrated in FIG. 1 in accordance with an embodiment of the present disclosure. Referring to FIG. 1, the flexible electronic component module 10 includes a first substrate 11, a second substrate 13, a first electrode layer 16 and a second electrode layer 15. The first substrate 11 and the second substrate 13 include flexible substrates. The first substrate 11 overlaps the second substrate 13 to define an overlapping region 84, at least one of a first exposed portion 12 and a second exposed portion 14. Referring to FIG. 2, the first electrode layer 16 is disposed on a lower surface 24 of the first substrate 11. The second electrode layer 15 is disposed on an upper surface 22 of the second substrate 13.

As shown in FIG. 1, the first electrode layer 16 of the first substrate 11 extends to the second exposed portion 14. The second electrode layer 15 of the second substrate 13 extends to the second exposed portion 14. The first exposed portion 12 includes a plurality of bump electrodes 82. Referring to FIG. 2, the flexible electronic component module 10 includes the first exposed portion 12, the second exposed portion 14, the first electrode layer 16, the second electrode layer 15, a plurality of supports 19 and a plurality of sensing conductors 18. In some embodiments, each of the bump electrodes 82 is partially facing the first electrode layer 16. In other embodiments, each of the bump electrodes 82 is partially facing the second electrode layer 15.

Moreover, referring to FIG. 2, the first electrode layer 16 of the overlapping region 84 includes a plurality of electrodes 89 and the second electrode layer 15 of the overlapping region 84 includes a plurality of electrodes 88. The electrodes 89 of the first electrode layer 16 are spaced from each other by an equivalent distance and the electrodes 88 of the second electrode layer 15 are spaced apart from each other by the equivalent distance.

Referring to FIG. 2, an electrode 89 of the first electrode layer 16 is coupled to an electrode 88 of the second electrode layer 15 via a sensing conductor 18. Moreover, the supports 19 are configured to support the first substrate 11 and the second substrate 13. In addition, each of the first exposed portion 12 and the second exposed portion 14 comprises a portion of the first substrate 11 and a portion of the second substrate 13.

Referring to FIG. 2, the first substrate 11 of the first exposed portion 12 comprises a first side 11a, and the second substrate 13 of the first positioned portion 12 comprises a second side 13b. The first side 11a is disposed more distant than the second side 13b. Also, the second substrate 13 of the second exposed portion 14 comprises a third side 13a, and the first substrate 11 of the second exposed portion 14 comprises a fourth side 11b. The third side 13a is positioned more distant than the fourth side 11b.

Referring to FIG. 2, among the plurality of electrodes 89, a distance M is measured from the first side 11a to the center of an electrode 89a closest to the first side 11a. Also, a distance P is measured from the second side 13b to the center of the electrode 89a closest to the second side 13b. Similarly, among the plurality of electrodes 89, a distance Q is measured from the third side 13a to the center of an electrode 89b closest to the third side 13a. Furthermore, a distance R is measured from the fourth side 11b to the center of the electrode 89b closest to the fourth side 11b.

Figure 3:
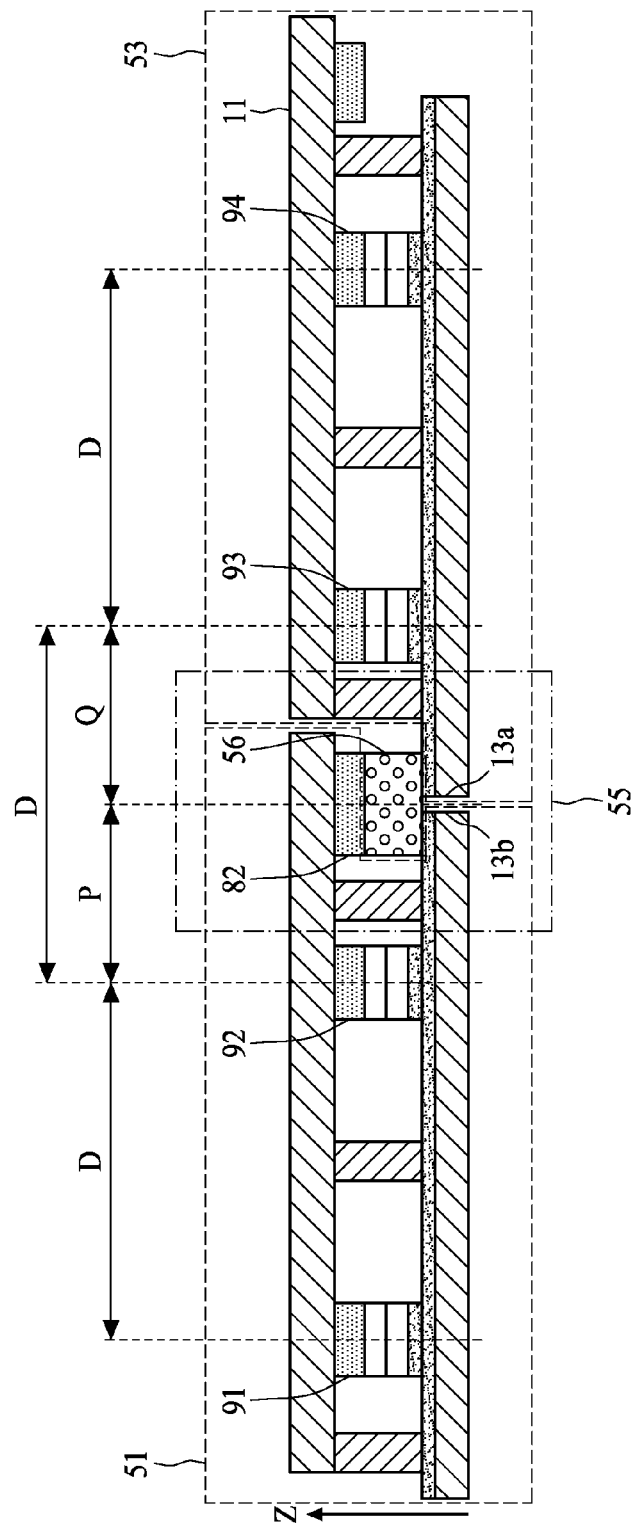
FIG. 3 is a diagram of a splice structure including flexible electronic component modules in accordance with an embodiment of the present disclosure.

FIG. 3 is a diagram of a splice structure 55 including flexible electronic component modules in accordance with one embodiment of the present disclosure. Referring to FIG. 3, the splice structure 55 includes the first exposed portion of the first flexible electronic component module 51 illustrated in FIG. 2, the second exposed portion of the second flexible electronic component module 53 illustrated in FIG. 2 and a vertical conductive layer 56.

The material of the vertical conductive layer 56 includes an anisotropic conductive film (ACF). The vertical conductive layer 56 is coupled between the bump electrode 82 of the first exposed portion of the first flexible electronic component module 51, the second electrode layer 15 of the first exposed portion of the first flexible electronic component module 51 and the second electrode layer 15 of the second exposed portion of the second flexible electronic component module 53. Therefore, the splice structure 55 is formed by the first exposed portion of the first flexible electronic component module 51 and the second exposed portion of the second flexible electronic component module 53.

Referring to FIG. 3, the center point of an electrode 91 of the first flexible electronic component module 51 is spaced apart from the center point of an electrode 92 of the first flexible electronic component module 51 by a distance D. The center point of the electrode 92 is spaced apart from the center point of an electrode 93 of the second flexible electronic component module 53 by the distance D. Moreover, the center point of the electrode 93 is spaced apart from an electrode 94 of the second flexible electronic component module 53 by the distance D.

Referring to FIG. 3, the center point of the bump electrode 82 of the first exposed portion of the first flexible electronic component module 51 is spaced apart from the center point of the electrode 92 by [a] the distance P. The center point of the electrode 93 is spaced apart from the center point of the bump electrode 82 by [a]the distance Q. As shown in FIG. 3, the distance P plus the distance Q is equal to the distance D. Effectively, the electrodes of the splice structure are spaced apart from each other by the distance D.

Referring to FIGS. 2 and 3, the distance measured from the second side 13b of the first flexible electronic component module 51 to the center of the electrode 92 is equal to the distance P. Also, the distance measured from the third side 13a of the second flexible electronic component module 53 to the center of the electrode 93 is equal to the distance Q. The distance P plus the distance Q is equal to the distance D.

Figure 4:
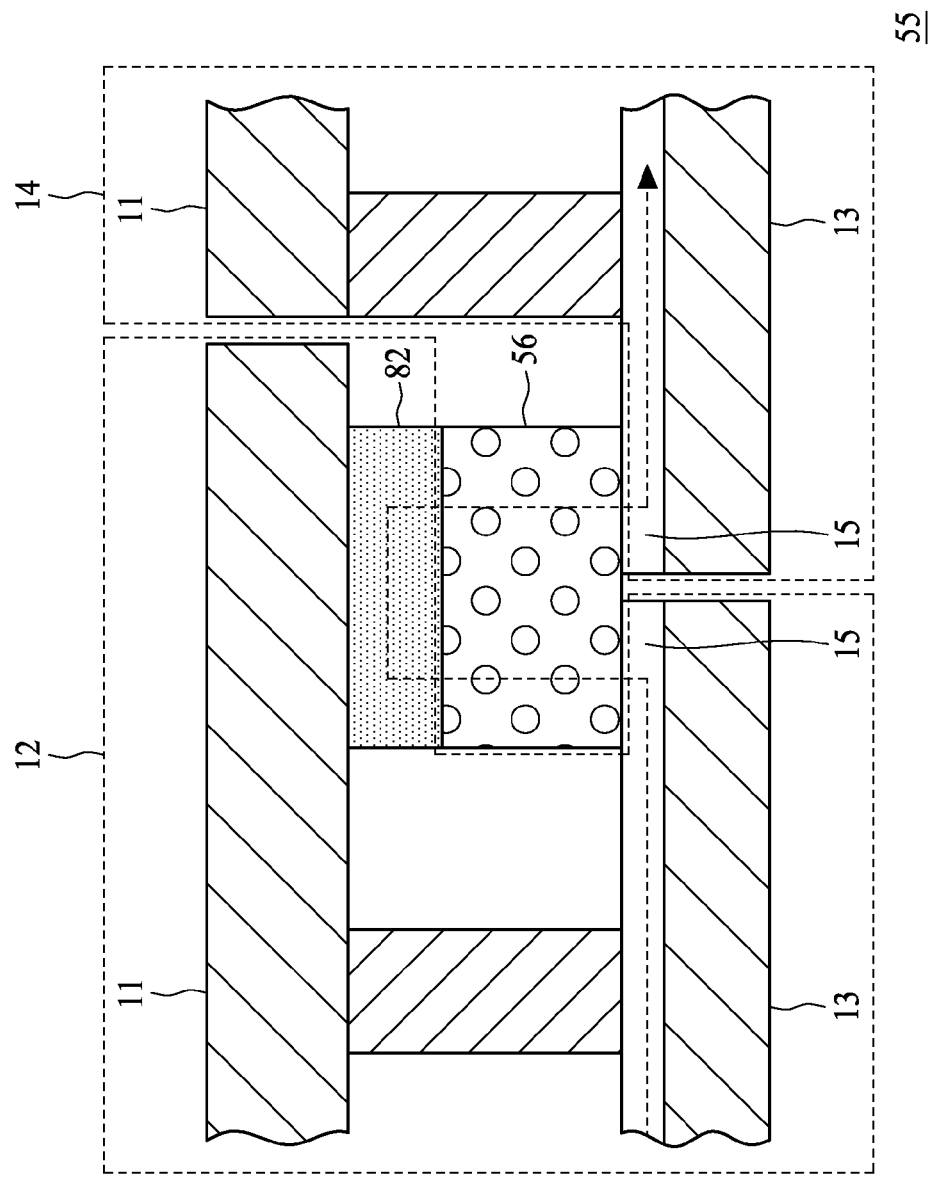
FIG. 4 is an enlarged diagram showing a signal transmitting path in the splice structure illustrated in FIG. 3 in accordance with an embodiment of the present disclosure.

FIG. 4 is an enlarged diagram showing a signal transmitting path of the splice structure 55 illustrated in FIG. 3 in accordance with an embodiment of the present disclosure. Referring to FIG. 4, the signal transmitting path is formed by the second electrode layer 15 of the first exposed portion 12 of the first flexible electronic component module, the vertical conductive layer 56, the bump electrode 82 of the first exposed portion 12 of the first flexible electronic component module, the vertical conductive layer 56 and the second electrode layer 15 of the second exposed portion 14 of the second flexible electronic component module.

Referring to FIG. 4, the first substrate 11 of the first exposed portion 12 and the first substrate 11 of the second exposed portion 14 are spliced in a coplanar fashion without overlapping. Also, the second substrate 13 of the first exposed portion 12 and the second substrate 13 of the second exposed portion 14 are spliced in a coplanar fashion without overlapping.

Figure 5:
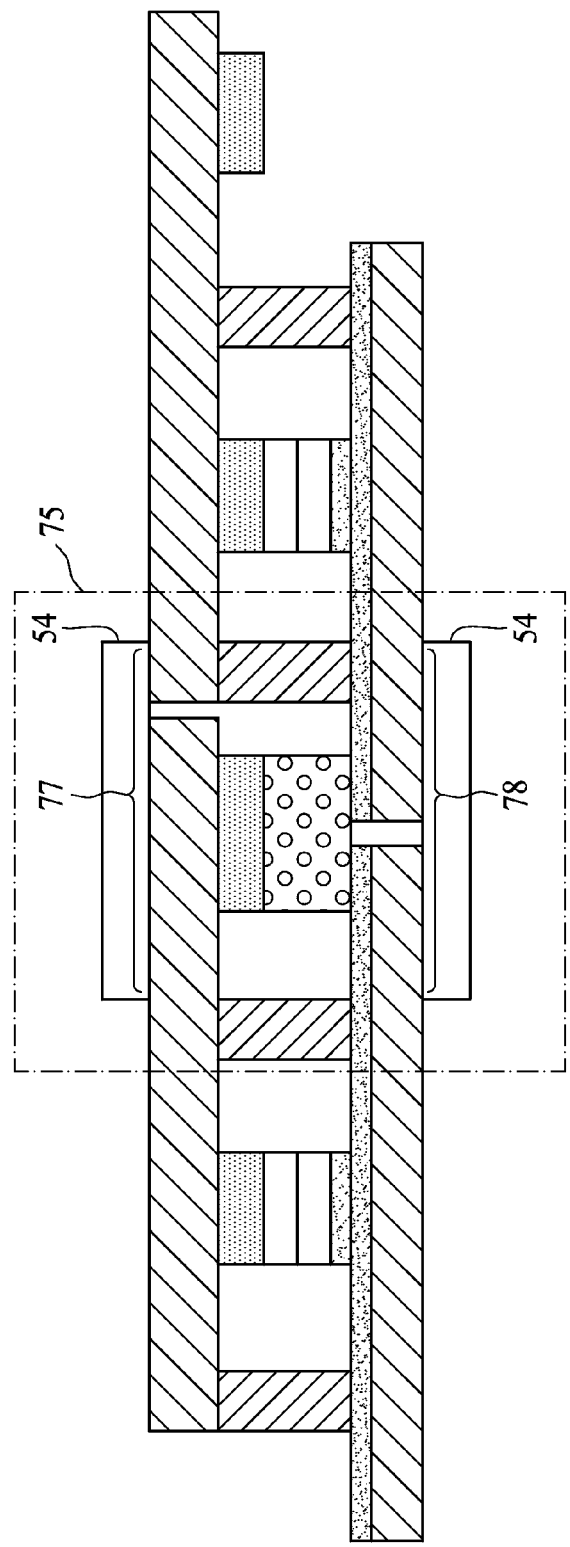
FIG. 5 is a diagram of a splice structure including flexible electronic component modules in accordance with another embodiment of the present disclosure.

FIG. 5 is a diagram of a splice structure 75 including flexible electronic component modules in accordance with another embodiment of the present disclosure. Referring to FIG. 5, the splice structure 75 illustrated in FIG. 5 is similar to the splice structure 55 illustrated in FIG. 3 except, for example, the splice structure 75 includes a reinforcement film 54 disposed on at least one of an upper surface 77 or a lower surface 78 of the splice structure 75. In some embodiments, the at least one reinforcement film 54 is disposed on the upper surface 77 and the lower surface 78 of the splice structure 75. The reinforcement film 54 includes a tape and is configured to prevent the signal transmitting path from damage due to dissection or break at the splice structure 75.

Figure 6:
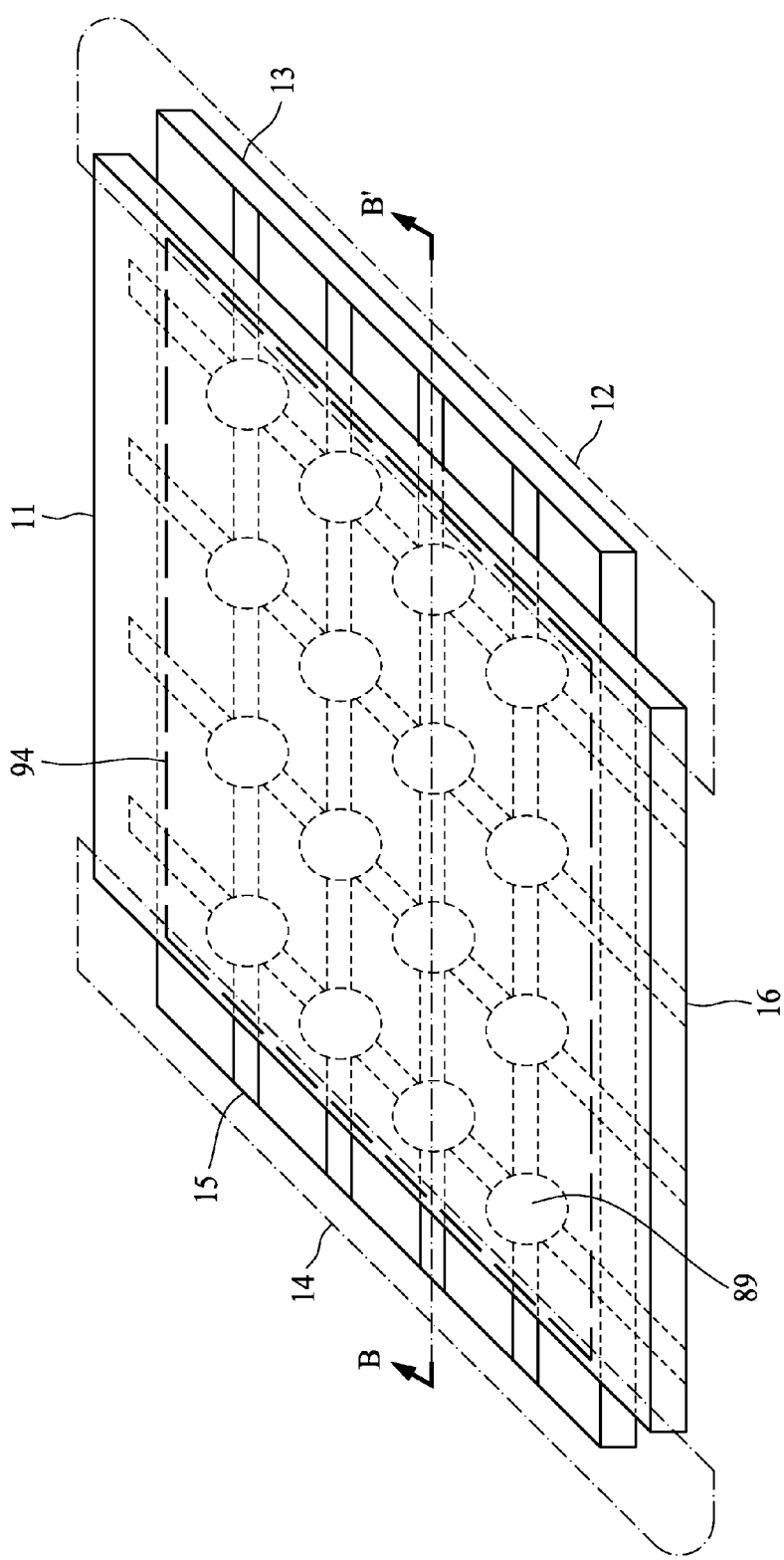
FIG. 6 is a schematic diagram of a flexible electronic component module in accordance with another embodiment of the present disclosure.
Figure 7:
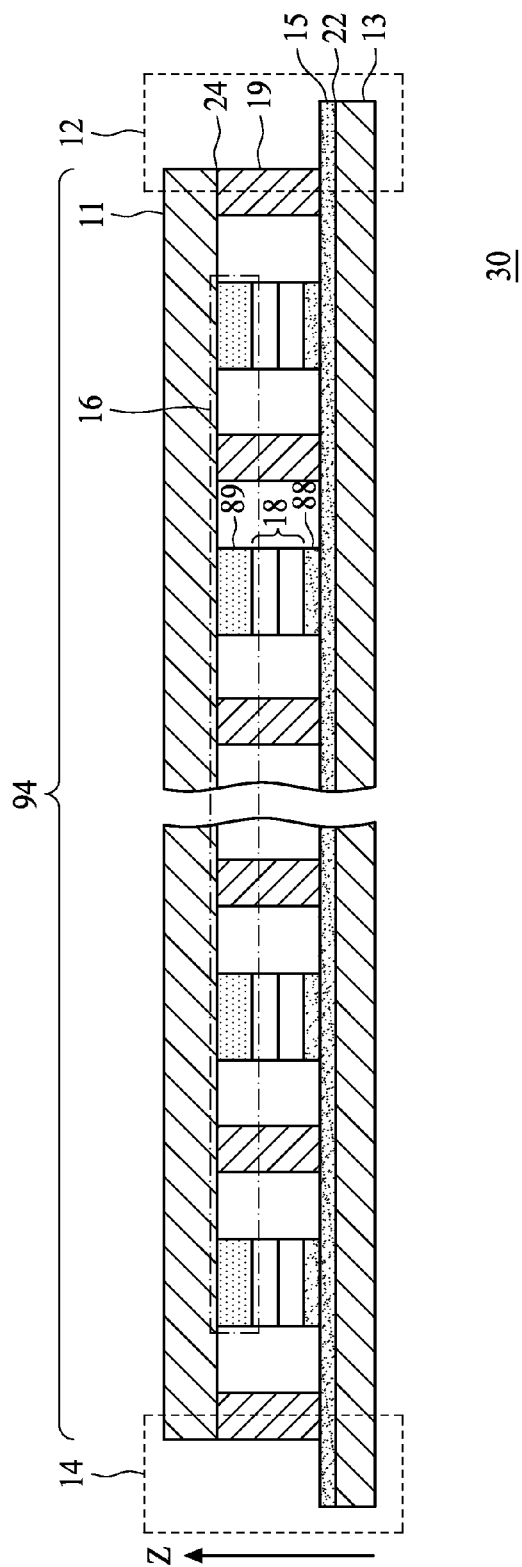
FIG. 7 is a cross-sectional view of the flexible electronic component module taken along a line BB' illustrated in FIG. 6 in accordance with an embodiment of the present disclosure.

FIG. 6 is a schematic diagram of a flexible electronic component module 30 in accordance with another embodiment of the present disclosure. FIG. 7 is a cross-sectional view of the flexible electronic component module 30 taken along the line BB' illustrated in FIG. 6 in accordance with an embodiment of the present disclosure. Referring to FIG. 6, the flexible electronic component module 30 includes a first substrate 11 and a second substrate 13. The first substrate 11 orthogonally overlaps the second substrate 13 to define at least one of a first exposed portion 12 and a second exposed portion 14. The first substrate 11 includes a first electrode layer 16 and the second substrate 13 includes a second electrode layer 15.

Referring to FIG. 7, the first electrode layer 16 is disposed on a lower surface 24 of the first substrate 11 and the second electrode layer 15 is disposed on an upper surface 22 of the second substrate 13 of the second electrode layer 15.

Referring to FIG. 6, the second electrode layer 15 of the second substrate 13 extends to the first exposed portion 12 and the second exposed portion 14.

Referring to FIG. 6, in some embodiments, the first electrode layer 16 of the first substrate 11 extends to two portions which are not overlapped by the second substrate 13.

Referring to FIG. 7, the flexible electronic component module 30 includes the first substrate 11, the second substrate 13, the first exposed portion 12, the second exposed portion 14, the first electrode layer 16, the second electrode layer 15, the sensing conductors 18 and the supports 19. The first electrode layer 16 includes the electrodes 89 and the second electrode layer includes the electrodes 88. One of the sensing conductors 18 is coupled between an electrode 89 of the first electrode layer 16 and an electrode 88 of the second electrode layer 15. The first electrode layer 16 of the overlapping region 94 includes the electrodes 89 and the second electrode layer 15 includes the electrodes 88. The first electrode layer 16 is coupled to the second electrode layer 15 via the electrodes 89, the sensing conductors 18 and the electrodes 88. Moreover, an electrode 89 of the first electrode layer is coupled to the second electrode layer 15 via a sensing conductor 18 and an electrode 88.

Referring to FIG. 7, the supports 19 are configured to support the first substrate 11 and the second substrate 13.

Figure 8:
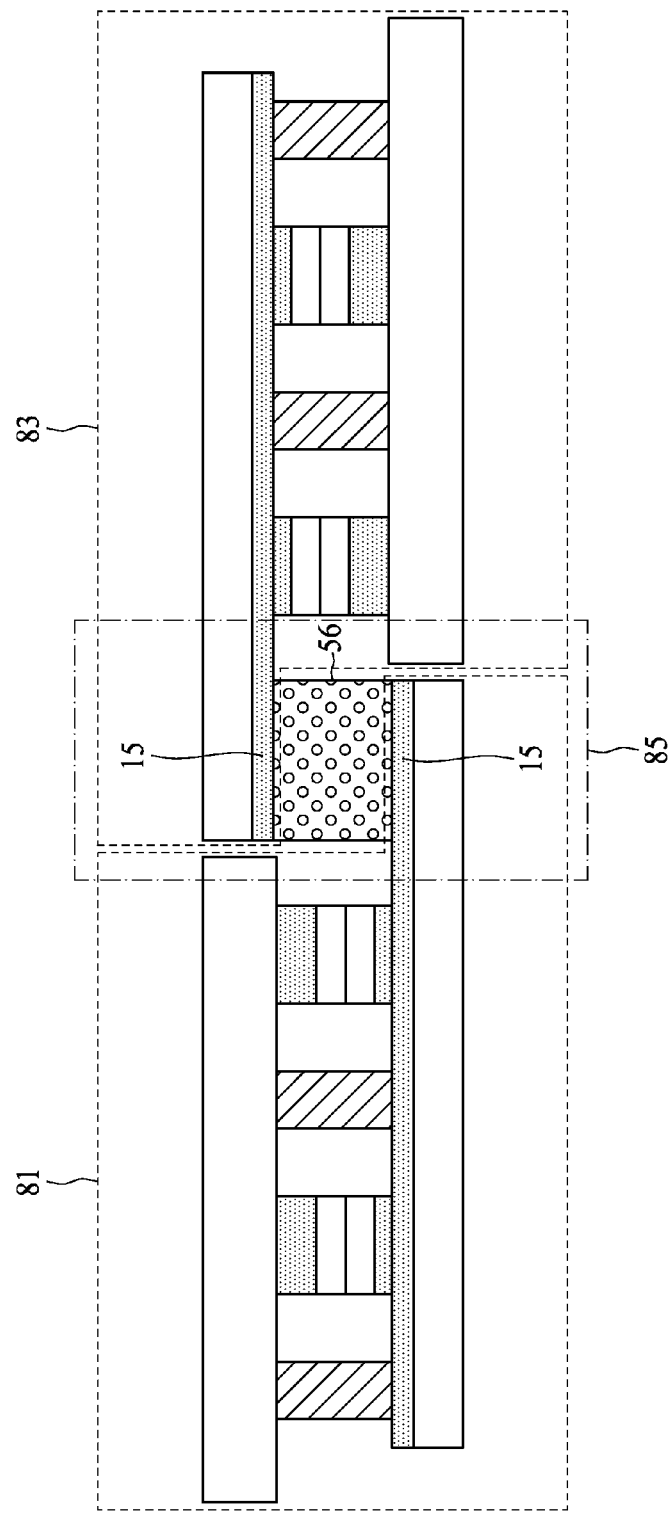
FIG. 8 is a diagram of a splice structure including flexible electronic component modules in accordance with still another embodiment of the present disclosure.

FIG. 8 is a splice structure 85 including flexible electronic component modules in accordance with still another embodiment of the present disclosure. Referring to FIG. 8, the splice structure 85 includes the first flexible electronic component module 81 illustrated in FIG. 7, the second flexible electronic component module 83 illustrated in FIG. 7 and a vertical conductive layer 56.

The vertical conductive layer 56 is coupled between the second electrode layer 15 of the first exposed portion of the first flexible electronic component module 81 and the second electrode layer 15 of the second exposed portion of the second flexible electronic component module 83. Therefore, the splice structure is formed by the first exposed portion of the first flexible electronic component module 81 and the second exposed portion of the second flexible electronic component module 83.

Figure 9:
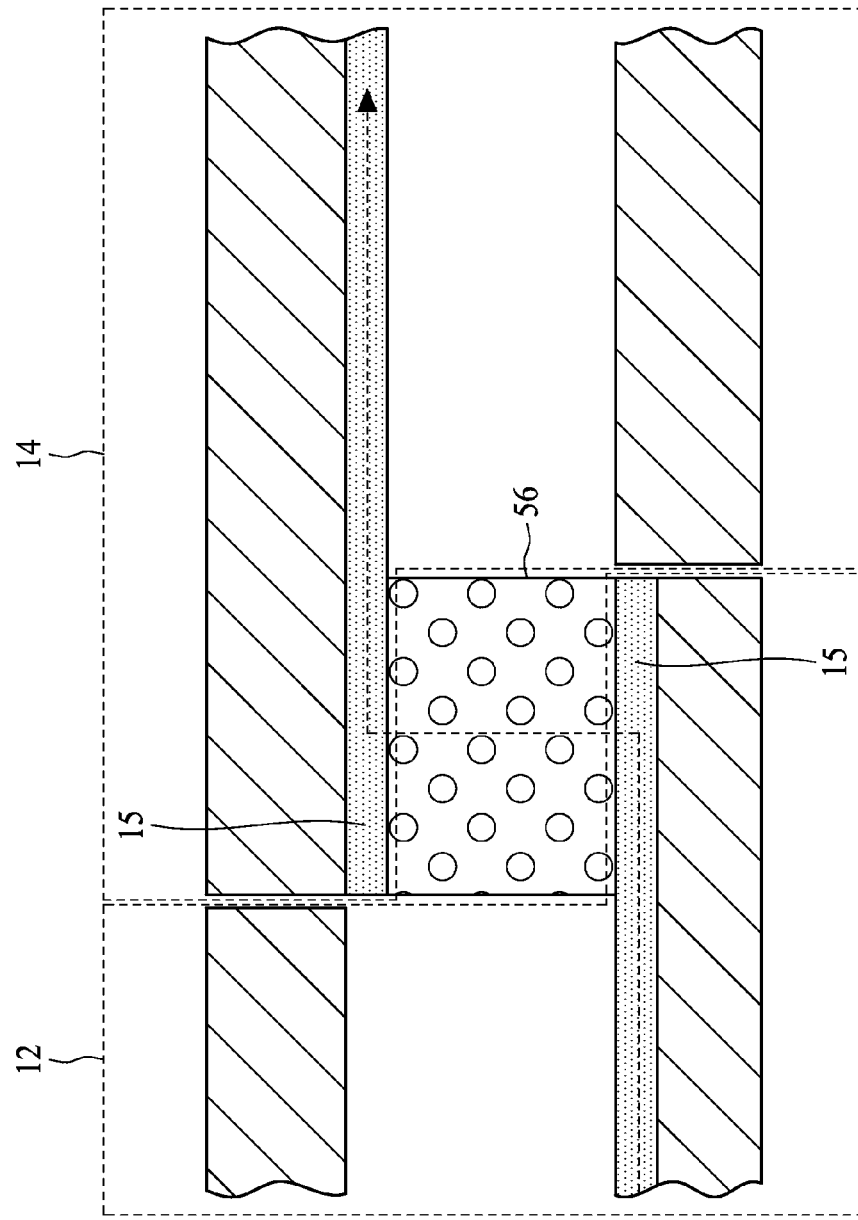
FIG. 9 is a diagram showing a signal transmitting path in the splice structure illustrated in FIG. 8 in accordance with an embodiment of the present disclosure.

FIG. 9 is a diagram showing a signal transmitting path in the splice structure 85 illustrated in FIG. 8 in accordance with an embodiment of the present disclosure. Referring to FIG. 9, the signal transmitting path is formed by the second electrode layer 15 of the first exposed portion 12 of the first flexible electronic component module, the vertical conductive layer and the second electrode layer 15 of the second exposed portion 14 of the second flexible electronic component module.

Figure 10:
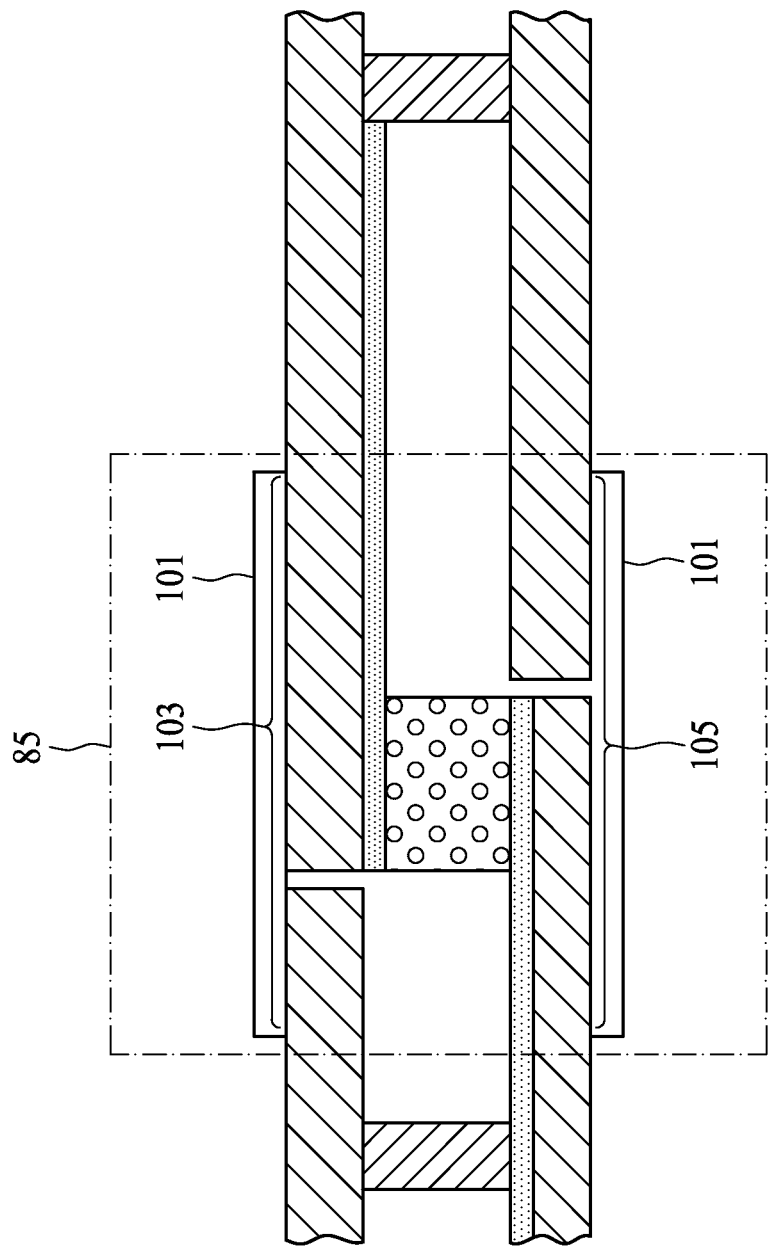
FIG. 10 is a diagram of a splice structure including flexible electronic component modules in accordance with yet another embodiment of the present disclosure.

FIG. 10 is a diagram of a splice structure 85 including flexible electronic component modules in accordance with yet another embodiment of the present disclosure. Referring to FIG. 10, the splice structure 85 illustrated in FIG. 10 is similar to the splice structure 85 illustrated in FIG. 9 except that, for example, the splice structure 85 includes a reinforcement film 101 disposed on at least one of an upper surface 103 or a lower surface 105 of the splice structure 85. In some embodiments, the reinforcement film 101 is disposed on the upper surface 103 and the lower surface 105 of the splice structure 85. The reinforcement film 101 includes a tape and is configured to prevent the signal transmitting path from damage due to dissection or break at the splice structure 85.

A number of embodiments of the disclosure have been described. It will nevertheless be understood that various modifications may be made without departing from the spirit and scope of the disclosure. Embodiments of the disclosure are applicable in various design choices.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:
1. A flexible electronic component module, comprising:
a first substrate including a first electrode layer on a lower surface thereof;
a second substrate including a second electrode layer on an upper surface thereof; and a plurality of electrodes between the first electrode layer and the second electrode layer, and the plurality of electrodes being spaced apart by a first distance;

wherein the first substrate overlaps the second substrate to define a first exposed portion and a second exposed portion;

wherein the first exposed portion comprises a first side and a second side, the first side being positioned more distant than the second side, the second exposed portion comprises a third side and a fourth side, the third side being positioned more distant than the fourth side, and the first distance is equal to a second distance from the second side to the center of one of the plurality of electrodes closest to the second side plus a third distance from the third side to the center of one of the plurality of electrodes closest to the third side.

2. The flexible electronic component module of claim 1, wherein the first electrode layer of the first substrate extends to the second exposed portion and the second electrode layer of the second substrate extends to the second exposed portion.

3. The flexible electronic component module of claim 1, wherein the second electrode layer of the second substrate extends to the first exposed portion and the second exposed portion.

4. The flexible electronic component module of claim 2, wherein the first exposed portion includes a plurality of bump electrodes.

5. The flexible electronic component module of claim 4, wherein the bump electrodes are disposed on one of the first electrode layer and the second electrode layer.

6. The flexible electronic component module of claim 1, wherein the first substrate overlaps the second substrate in an overlapping region, further comprising in the first electrode layer at the overlapping region the plurality of electrodes, in the second electrode layer at the overlapping region the plurality of electrodes, and in the overlapping region a sensing conductor coupled between each of the electrodes in the first electrode layer and each of the electrodes in the second electrode layer.

7. The flexible electronic component module of claim 4, wherein each of the bump electrodes is partially facing the first electrode layer or the second electrode layer.

8. The flexible electronic component module of claim 6, wherein the electrodes are spaced apart from each other by an equivalent distance.

9. A splice structure including flexible electronic component modules,
the splice structure comprising:
a first flexible electronic component module and a second flexible electronic component module, each of the first and second flexible electronic component modules comprising:
a first substrate including a first electrode layer disposed on a lower surface of the first substrate;
a second substrate including a second electrode layer disposed on an upper surface of the second substrate;
wherein the first substrate overlaps the second substrate to define at least one of a first exposed portion and a second exposed portion, and each of the first exposed portion and the second exposed portion comprises a portion of the first substrate and a portion of the second substrate;

wherein the first electrode layer of the first substrate extends to the second exposed portion, and the second electrode layer of the second substrate extends to the second exposed portion;

wherein the first exposed portion includes a plurality of bump electrodes disposed on the first electrode layer or the second electrode layer; and wherein each of the bump electrodes is partially facing the electrode layer; and a vertical conductive layer electrically in contact with the bump electrodes of the first exposed portion of the first flexible electronic component module, and coupled between one of the first electrode layer and the second electrode layer of the first exposed portion of the first flexible electronic component module, and one of the first electrode layer and the second electrode layer of the second exposed portion of the second flexible electronic component module;

wherein the first substrate of the first exposed portion of the first flexible electronic component module and the first substrate of the second exposed portion of the second flexible electronic component module are spliced in a coplanar fashion without overlapping;

wherein the second substrate of the first exposed portion of the first flexible electronic component module and the second substrate of the second exposed portion of the second flexible electronic component module are spliced in a coplanar fashion without overlapping.

10. The splice structure of claim 9, wherein the first substrate of the first flexible electronic component module overlaps the second substrate of the first flexible electronic component module in an overlapping region, further comprising in the first electrode layer at the overlapping region a plurality of electrodes, in the second electrode layer at the overlapping region a plurality of electrodes, and in the overlapping region a sensing conductor coupled between each of the electrodes of the first electrode layer and each of the electrodes of the second electrode layer.

11. The splice structure of claim 9, wherein the first substrate of the second flexible electronic component module overlaps the second substrate of the at least one second flexible electronic component module in an overlapping region, further comprising in the first electrode layer at the overlapping region a plurality of electrodes, in the second electrode layer at the overlapping region a plurality of electrodes, and in the overlapping region a sensing conductor coupled between each of the electrodes of the first electrode layer and each of the electrodes of the second electrode layer.

12. The splice structure of claim 9, wherein the electrodes of the first flexible electronic component module are spaced apart from each other by an equivalent distance.

13. The splice structure of claim 9, wherein the electrodes of the second flexible electronic component module are spaced apart from each other by an equivalent distance.

14. The splice structure of claim 9 further comprising at least one reinforcement film disposed on at least one of an upper surface or a lower surface of the splice structure.

15. The splice structure of claim 14, wherein the reinforcement film includes a tape.

16. The splice structure of claim 9, wherein the vertical conductive layer includes an anisotropic conductive film (ACF).

* * * * *